US012737018B2

(12) United States Patent
Chen et al.

(10) Patent No.: US 12,737,018 B2
(45) Date of Patent: Sep. 15, 2026

(54) HEATING MODULE AND COMPUTING SYSTEM INCLUDING THE SAME

(71) Applicant: Quanta Computer Inc., Taoyuan City (TW)

(72) Inventors: Yi-Chieh Chen, Taoyuan City (TW); Yueh-Chang Wu, Taoyuan City (TW); Te-Chuan Wang, Taoyuan City (TW); Samuel Chatelier, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 248 days.

(21) Appl. No.: 18/637,789

(22) Filed: Apr. 17, 2024

(65) Prior Publication Data

US 2025/0328175 A1 Oct. 23, 2025

(51) Int. Cl.
*H05K 7/14* (2006.01)
*G06F 1/20* (2006.01)

(52) U.S. Cl.
CPC .......... *G06F 1/206* (2013.01); *H05K 7/1427* (2013.01)

(58) Field of Classification Search
CPC ...... G06F 1/206; G05D 23/32; H05K 1/0209; H05K 1/0212; H10W 40/10
USPC ........................................................ 165/185
See application file for complete search history.

(56) References Cited

U.S. PATENT DOCUMENTS

| | | | | |
|---|---|---|---|---|
| 6,888,238 B1 * | 5/2005 | Li | H10W 76/12 257/706 |
| 8,812,169 B2 * | 8/2014 | Leech | G06F 1/20 712/205 |
| 2014/0016261 A1 * | 1/2014 | Lin | G06F 1/20 361/679.33 |
| 2018/0261804 A1 * | 9/2018 | Bayles | H01M 50/227 |

FOREIGN PATENT DOCUMENTS

| | | |
|---|---|---|
| CN | 109285816 A | 1/2019 |
| TW | M524617 U | 6/2016 |

OTHER PUBLICATIONS

TW Office Action for Application No. 113123579 mailed Feb. 24, 2025, w/ First Office Action Summary, 7 pp.
TW Search Report for Application No. 113123579 mailed Feb. 24, 2025, w/ First Office Action, 1 p.

* cited by examiner

*Primary Examiner* — Mandeep S Buttar
(74) *Attorney, Agent, or Firm* — Nixon Peabody LLP

(57) ABSTRACT

A computing system is disclosed. The computing system includes a system chassis configured to perform as a heat-sink; a printed circuit board (PCB) enclosed within the system chassis; a central processing unit (CPU) mounted on the PCB within the system chassis; a film heater enclosed within the system chassis, the film heater being configured to generate heat for maintaining the CPU within an operable temperature range; and a heat spreader mounted between the CPU and the film heater. The heat spreader is configured to conduct the heat from the film heater to the CPU without affecting the layout of the PCB.

17 Claims, 7 Drawing Sheets

HEATING MODULE AND COMPUTING SYSTEM INCLUDING THE SAME

FIELD OF THE INVENTION

The present invention relates generally to a heating module for a computing system, and more specifically, to a heat spreader of the heating module mounted between a central processing unit (CPU) and a film heater. The film heater is configured to generate heat for maintaining the CPU within an operable temperature range. The heat spreader used in the heating module/computing system does not impact the layout of a printed circuit board (PCB) by avoiding mounting of the film heater directly on the PCB. Moreover, the heating module can reduce the total power consumption by the film heater significantly compared to the conventional film heater that is mounted directly on the PCB around the CPU or directly on the system chassis.

BACKGROUND OF THE INVENTION

With the recent advancements in the telecommunications industry and the need to provide distinct and reliable users' experience, both 5G and mobile edge computing will open the door to various opportunities in different fields such as manufacturing, healthcare, construction, gaming and entertainment, transport, retail and more. For such applications, the main goal for edge computing is to bring the computing capacity into the network, and closer to users, devices, and/or data sources. Depending on the use case, the location of the infrastructure for edge computing can vary from controlled protected environments (on-premises at an enterprise) to unprotected environments, where the product is directly exposed to outside weather conditions. NEBS (Network Equipment-Building System) generic requirements 3108 (GR-3108) document defines four classes for outside plant equipment and their respective operating environments. Class 2 to Class 4 products are designed to be operated in outside environments, and GR-3108 stipulates that these products should be able to perform a cold start at temperatures as low as −40° C. In general, CPU might experience some functional issues when performing cold start at temperatures lower than 0° C.

However, it is quite difficult for most common processors to successfully boot-up at such low temperatures. Therefore, to mitigate this problem, outdoor products need to have a heating mechanism. In general, the heating mechanism includes a film heater 100 shown in FIG. 1A. FIG. 1B shows components of the film heater 100. In general, as shown in FIGS. 2A and 3A, the film heaters 100 are installed on a motherboard or PCB 200 around a CPU 300 to maintain the CPU at temperatures higher than 0° C. In particular, the heat generated by the film heaters 100 are conducted to the CPU 300, as shown by arrows in FIG. 2A. Although such film heaters 100 can be cut out in any shape to be attached on the motherboard or PCB 200, placement of the film heaters 100 directly on the motherboard or PCB 200 impacts the board layout. That is, no other components can be placed in the heater keep-out zones of the motherboard or PCB 200. FIG. 2B shows heat distribution of the computing system shown in FIG. 2A, where the film heaters 100 are heated and the heat is conducted to the CPU 300 to warm up the CPU.

Alternatively, as shown in FIG. 3B, the film heaters 100 may be installed on a system chassis 400. However, when the film heaters 100 are installed on the inner surface area of the system chassis 400, most of the heat generated by the film heaters 100 is lost to the outside environments, resulting in higher heater power consumption.

FIGS. 3A and 3B are side views of conventional heating mechanisms. The film heaters 100 are directly placed on the motherboard or PCB 200 in FIG. 3A and the film heaters 100 are in direct contact with the system chassis 400 in FIG. 3B. In FIGS. 3A and 3B, a thermal pad 500 is in direct contact with the CPU 300. The thermal pad 500 is also in direct contact with the system chassis 400 that performs as a heat sink.

FIG. 4A is a top view of a conventional heating mechanism included in a prior art computing system 600. FIG. 4B shows the prior art computing system 600, including the conventional heating mechanism. As shown in FIG. 4A, in the conventional heating mechanism, the film heaters 100 are mounted on the motherboard or PCB 200 around the CPU 300 to conduct heat (indicated by arrows) generated by the film heaters 100 to the CPU 300. Thus, the film heaters 100 occupy some areas of the motherboard or PCB 200, therefore affecting the board layout.

Therefore, a need exists for a heating mechanism that does not affect the layout of the motherboard or PCB within a system chassis of a computing system. A need also exists for a configuration of a film heater that can improve the heating efficiency by reducing the total power consumption.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In view of the above-described problems with the conventional heating mechanism of a computing system, the present application discloses a heating module that does not affect the layout of a motherboard or PCB. Further, the heating module disclosed in the present application also has an improved heating efficiency compared to the conventional heating mechanism, thus reducing the total power consumption required for heat generation/maintenance.

According to certain aspects of the present disclosure, a computing system is disclosed. According to various embodiments, the computing system includes a system chassis configured to perform as a heatsink; a printed circuit board (PCB) enclosed within the system chassis; a central processing unit (CPU) mounted on the PCB within the system chassis; a film heater enclosed within the system chassis, in which the film heater is configured to generate heat for maintaining the CPU within an operable temperature range; and a heat spreader mounted between the CPU and the film heater. The heat spreader is configured to conduct the heat from the film heater to the CPU.

According to another aspect of the computing system, the computing system further includes a thermal pad mounted in direct contact between the heat spreader and the system chassis.

According to another aspect of the computing system, an area of the heat spreader is greater than an area of the CPU.

According to another aspect of the computing system, a length of the heat spreader is 50 millimeters (mm)-100 mm or about 50 mm-about 100 mm and a width of the heat spreader is 50 mm-100 mm or about 50 mm-about 100 mm. In various embodiments, the heat spreader has a shape of a rectangle.

According to another aspect of the computing system, the film heater is mounted on peripheral areas or near four side edges of the heat spreader. In various embodiments, the film heater surrounds an area of the heat spreader having a shape of a rectangle.

According to another aspect of the computing system, the computing system further includes a thermal pad mounted on the area of the heat spreader such that the thermal pad is surrounded by the film heater. In various embodiments, the thermal pad is configured to conduct the heat from the heat spreader to the system chassis. In various embodiments, a thickness of the thermal pad is greater than a thickness of the film heater. In various embodiments, an area of the thermal pad is substantially same as an area of the CPU. In various embodiments, the thermal pad does not contact the CPU directly.

According to another aspect of the computing system, the film heater does not contact the system chassis, the CPU, and the PCB directly. In various embodiments, a space is formed between the heat spreader and the PCB such that a PCB layout is not affected by the film heater.

According to another aspect of the computing system, the heat spreader is made of aluminum or copper.

According to another aspect of the computing system, the operable temperature range is above 0° C. prior to booting up of the computing system, even when an environmental temperature is below 0° C., or when the environmental temperature is −10° C., −20° C., −30° C., or −40° C.

According to another aspect of the computing system, a thickness of the film heater is in a range of 0.15 mm-0.3 mm or about 0.15 mm-about 0.3 mm, and a thickness of the heat spreader is in a range of 0.6 mm to 2.0 mm or about 0.6 mm to about 2.0 mm.

According to another aspect of the computing system, a thermal grease is used as an interface between the heat spreader and the CPU.

According to other aspects of the present disclosure, a heating module configured to heat a central processing unit (CPU) is disclosed. According to various embodiments, the heating module includes a film heater configured to generate heat and a heat spreader made of aluminum or copper. The heat spreader is configured to conduct the heat from the film heater to the CPU. The film heater is mounted on the heat spreader. The heating module is configured to be mounted on the CPU. An area of the heat spreader is greater than an area of the CPU.

In various embodiments, the heating module further includes a thermal pad placed on the heat spreader, where the thermal pad is surrounded by the film heater. In various embodiments, a thermal grease is applied between the heat spreader and the CPU. In various embodiments, a thickness of the thermal pad is greater than a thickness of the film heater. In various embodiments, the area of the heat spreader is greater than an area of the thermal pad or the area of the thermal pad is substantially same as the area of the CPU. In various embodiments, the thermal pad does not contact the CPU directly.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 4A shows a magnified view of the heating mechanism included in the prior art computing system shown in FIG. 4B. The top drawing shows the external appearance of the prior art computing system, and the bottom drawing shows the internal view of the prior art computing system.

DETAILED DESCRIPTION

Figures 1A, 1B:
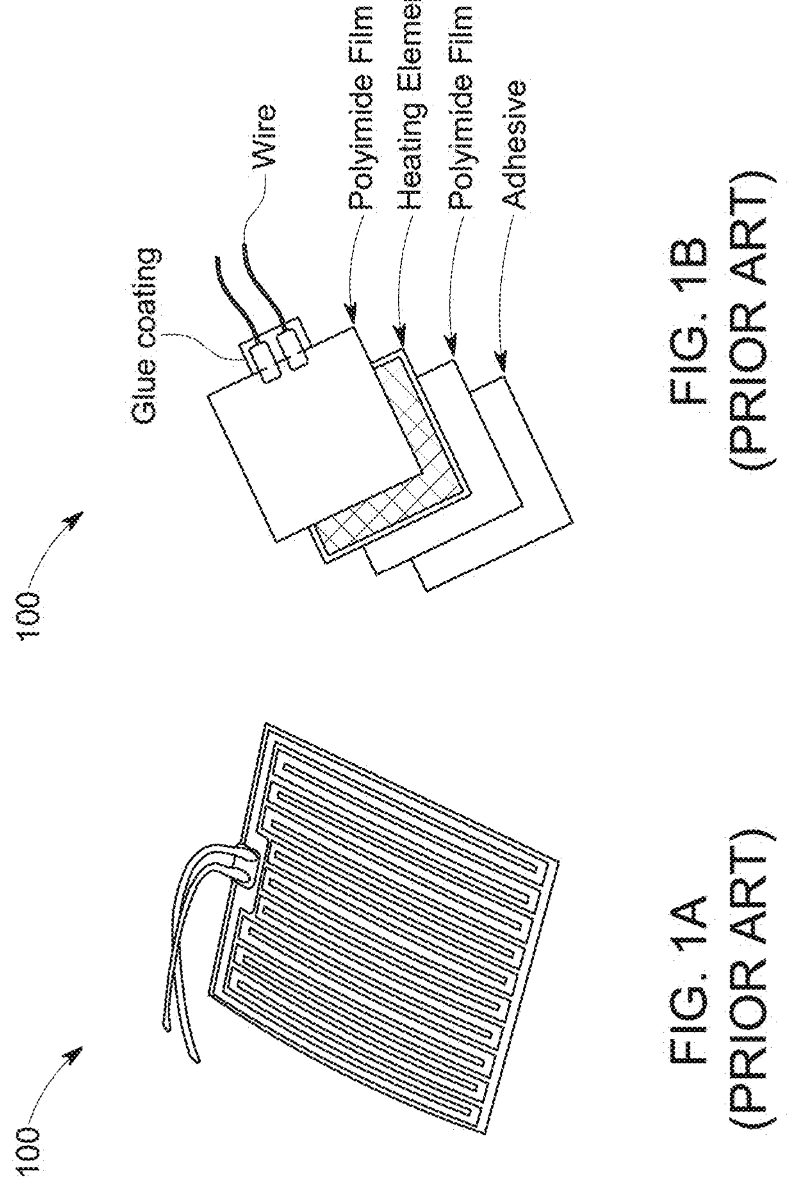
FIG. 1A shows a prior art film heater.
FIG. 1B shows components of the prior art film heater shown in FIG. 1A.
Figure 2B:
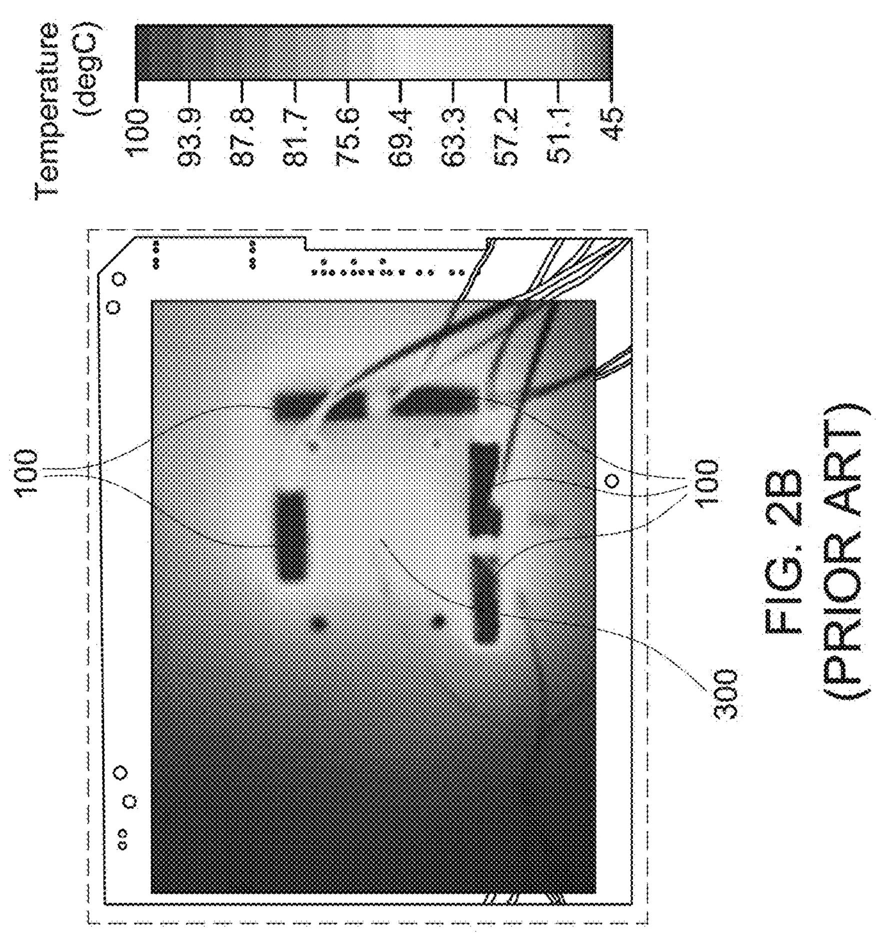
FIG. 2B is a heat distribution map of the view shown in FIG. 2A.
Figure 2A:
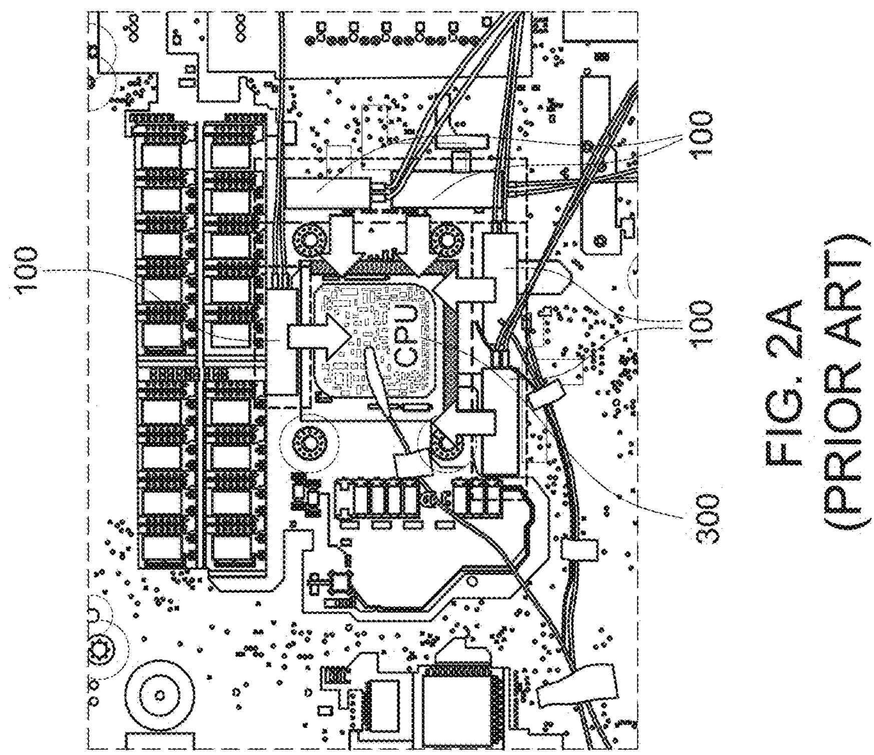
FIG. 2A is a top view of a portion of a computing system with a conventional heating mechanism including film heaters.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 5:
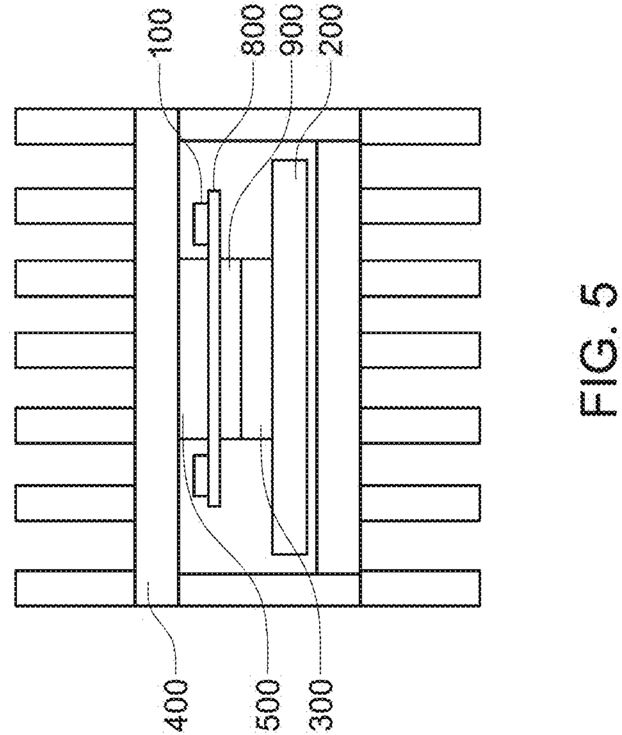
FIG. 5 is a schematic side view of a computing system with a heating module including a heat spreader, according to certain aspects of the present disclosure.

FIG. 5 is a schematic side view of a computing system with a heating module including a heat spreader, according to certain aspects of the present disclosure. Referring to FIG. 5, a computing system 700 (shown in FIGS. 6A and 6B) according to various embodiments of the present invention, includes a system chassis 400 configured to perform as a heatsink; a printed circuit board (PCB) 200 enclosed within the system chassis 400; a central processing unit (CPU) 300 mounted on the PCB 200 within the system chassis 400; and a film heater 100 enclosed within the system chassis 400. In various embodiments, the system chassis 400 has fins. In various embodiments, the film heater 100 is a polyimide film heater. The film heater 100 is configured to generate heat for maintaining the CPU 300 within an operable temperature range. For example, the operable temperature range starts from a minimum temperature that is higher than 0° C.

Figure 6A:
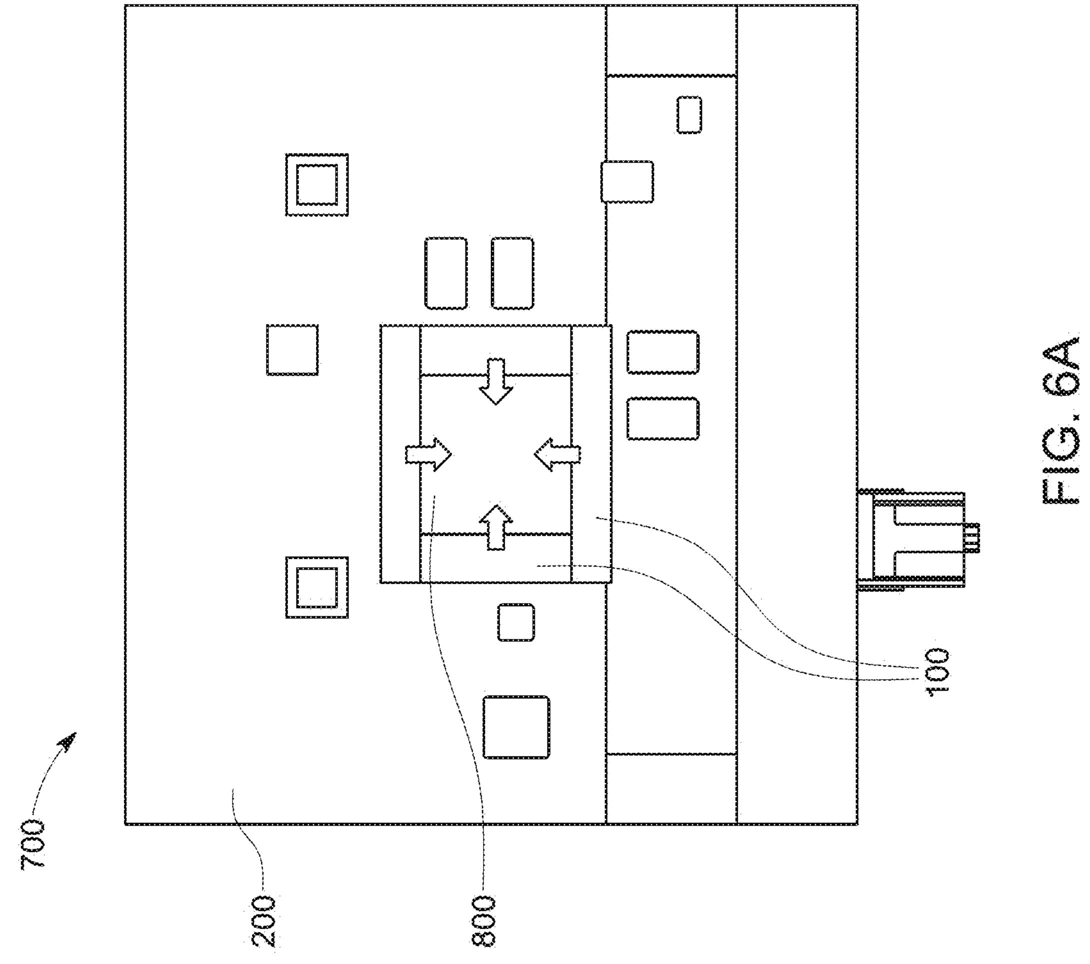
FIG. 6A is a top view of a computing system with a heating module, according to certain aspects of the present disclosure.
Figure 6B:
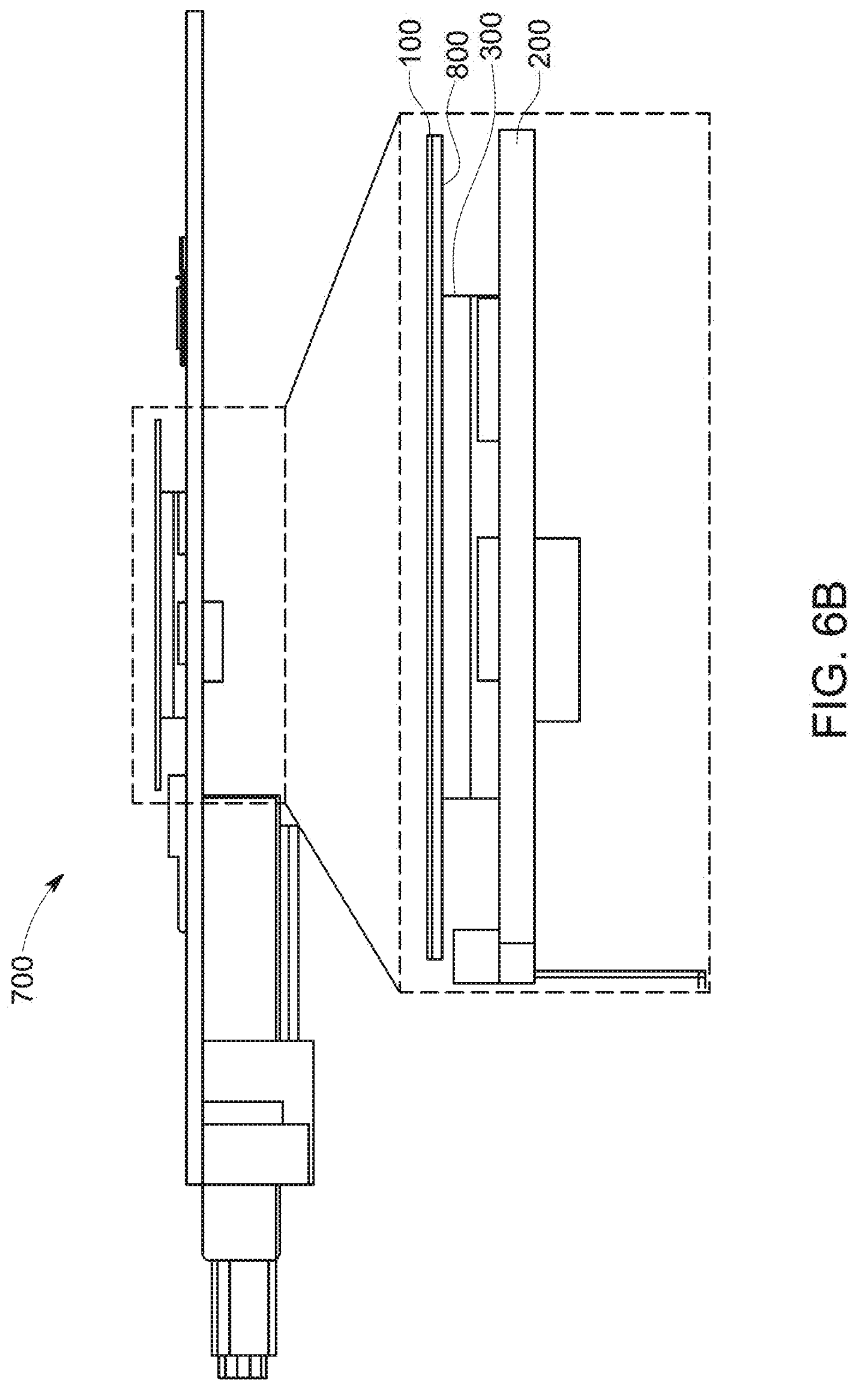
FIG. 6B is a side view of the computing system including the heating module shown in FIG. 6A, according to certain aspects of the present disclosure, a magnified view of the heating module being shown.

The computing system 700 further includes a heat spreader 800 mounted between the CPU 300 and the film heater 100. As shown in FIG. 6A, the film heaters 100 generate heat (indicated by arrows) which is conducted to the heat spreader 800. Subsequently, the heat spreader 800 is configured to conduct the heat from the film heater 100 to the CPU 300. See FIG. 6B showing the heat spreader 800 that is in contact with the CPU 300. In some embodiments, a thermal grease 900 is used as an interface between the heat spreader 800 and the CPU 300.

Further referring to FIG. 5, the computing system 700 further includes a thermal pad 500 mounted in direct contact between the heat spreader 800 and the system chassis 400. According to an embodiment of the present invention, an area of the heat spreader 800 is greater than an area of the CPU 300. For example, a length of the heat spreader 800 is 50 millimeters (mm)-100 mm or about 50 mm-about 100 mm. Further, a width of the heat spreader 800 is 50 mm-100 mm or about 50 mm-about 100 mm. In various embodiments, the heat spreader 800 has a shape of a rectangle. In some embodiments the rectangle is a square.

As shown in FIG. 6A, the film heater 100 is mounted on peripheral areas or near four side edges of the heat spreader 800. In some embodiments, the film heater 100 surrounds an area of the heat spreader 800 having a shape of a rectangle. In some embodiments, the rectangle is a square.

In some embodiments, the thermal pad 500 is mounted on the area of the heat spreader 800 such that the thermal pad 800 is surrounded by the film heater 100. The thermal pad 500 is configured to conduct the heat from the heat spreader 800 to the system chassis 400. In various embodiments, a thickness of the thermal pad 500 is greater than a thickness of the film heater 100. In various embodiments, an area of the thermal pad 500 is substantially same as an area of the CPU 300. Referring to FIG. 5, the thermal pad 500 does not contact the CPU 300 directly. Further, the film heater 100 does not contact the system chassis 400, the CPU 300, and the PCB 200 directly. Therefore, a space is formed between the heat spreader 800 and the PCB 200. Thus, by using the heat spreader 800 on which the film heater 100 is mounted, a PCB layout is not affected by the film heater 100.

In various embodiments, the heat spreader 800 is made of aluminum or copper. In various embodiments, the operable temperature range of the CPU 300 is above 0° C. prior to booting up of the computing system 700 even when the environmental temperature is below 0° C., or when the environmental temperature is −10° C., −20° C., −30° C., or −40° C.

According to various embodiments, as shown in FIGS. 5, 6A, and 6B, a heating module configured to heat the CPU 300 includes a film heater 100 configured to generate heat and a heat spreader 800 made of aluminum or copper. The heat spreader 800 is configured to conduct the heat from the film heater 100 to the CPU 300. The film heater 100 is mounted on the heat spreader 800. The heating module including the film heater 100 and the heat spreader 800 is configured to be mounted on the CPU 300. Referring to FIG. 5, a thermal grease 900 is used as an interface between the heat spreader 800 and the CPU 300 when the heating module is placed on the CPU 300.

In various embodiments, a thickness of the thermal pad 500 is greater than a thickness of the film heater 100. In various embodiments, the area of the heat spreader 800 is greater than an area of the thermal pad 500. In various embodiments, the area of the thermal pad 500 is substantially same as the area of the CPU 300. The thermal pad 500 does not contact the CPU 300 directly, as shown in FIG. 5.

In various embodiments, an area of the heat spreader 800 is greater than an area of the CPU 300. In various embodiments, a thickness of the film heater 100 is less than a thickness of the heat spreader 800. For example, the thickness of the film heater 100 is in a range of 0.15 mm-0.3 mm or about 0.15 mm-about 0.3 mm. For example, the thickness of the heat spreader 800 is in a range of 0.6 mm to 2.0 mm or about 0.6 mm to about 2.0 mm.

Thermal simulations were conducted for the conventional heating mechanism and the inventive heating module. The following table shows the results of the experiments. Case identifiers C1, C2, and C3 refer to thermal simulations performed for the conventional heating mechanism. Case identifiers P1 and P2 refer to thermal simulations performed for the inventive heating module described above.

| Case Identifier | Condition/Power Consumption | CPU Temperature | Heater maximum temperature |
|---|---|---|---|
| C1 (No heater activation) | Environmental Temperature 55° C. | 89.9° C. | N/A |

-continued

| Case Identifier | Condition/Power Consumption | CPU Temperature | Heater maximum temperature |
|---|---|---|---|
| C2 (Heater mounted on PCB) | Environmental Temperature −40° C. Heater power 108 W | 0.5° C. | 241° C. |
| C3 (Heater mounted on system chassis) | Environmental Temperature −40° C. Heater power 100 W | 0.5° C. | 2.1° C. |
| P1 (No heater activation) | Environmental Temperature 55° C. | 90.1° C. | N/A |
| P2 | Environmental Temperature −40° C. Heater power 48 W | 0.1° C. | 29.3° C. |

Figure 3B:
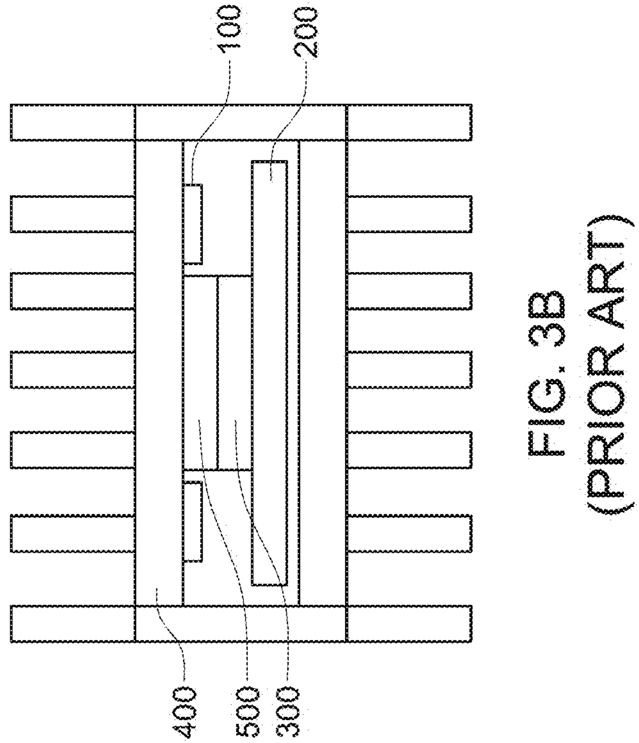
FIG. 3B is a schematic side view of a prior art computing system in which film heaters are mounted on an inner surface of a system chassis.
Figure 3A:
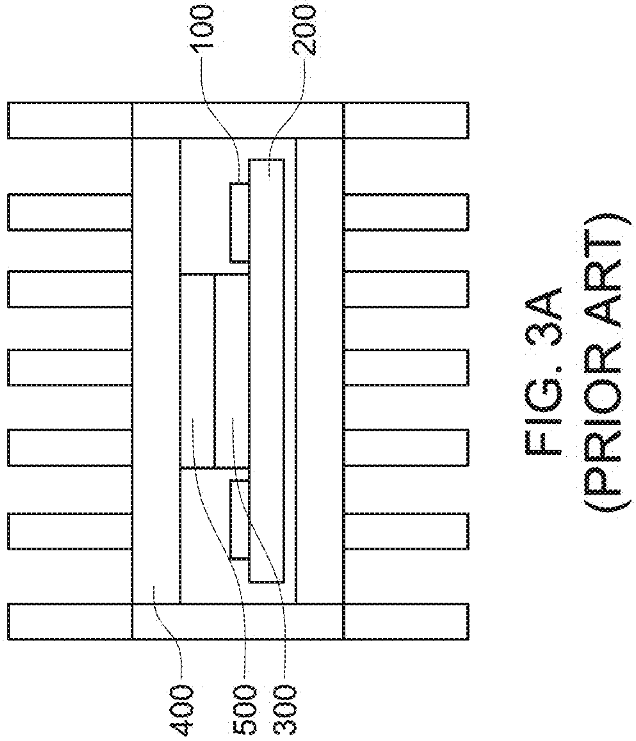
FIG. 3A is a schematic side view of a prior art computing system in which film heaters are mounted on a PCB.
Figures 4A, 4B:
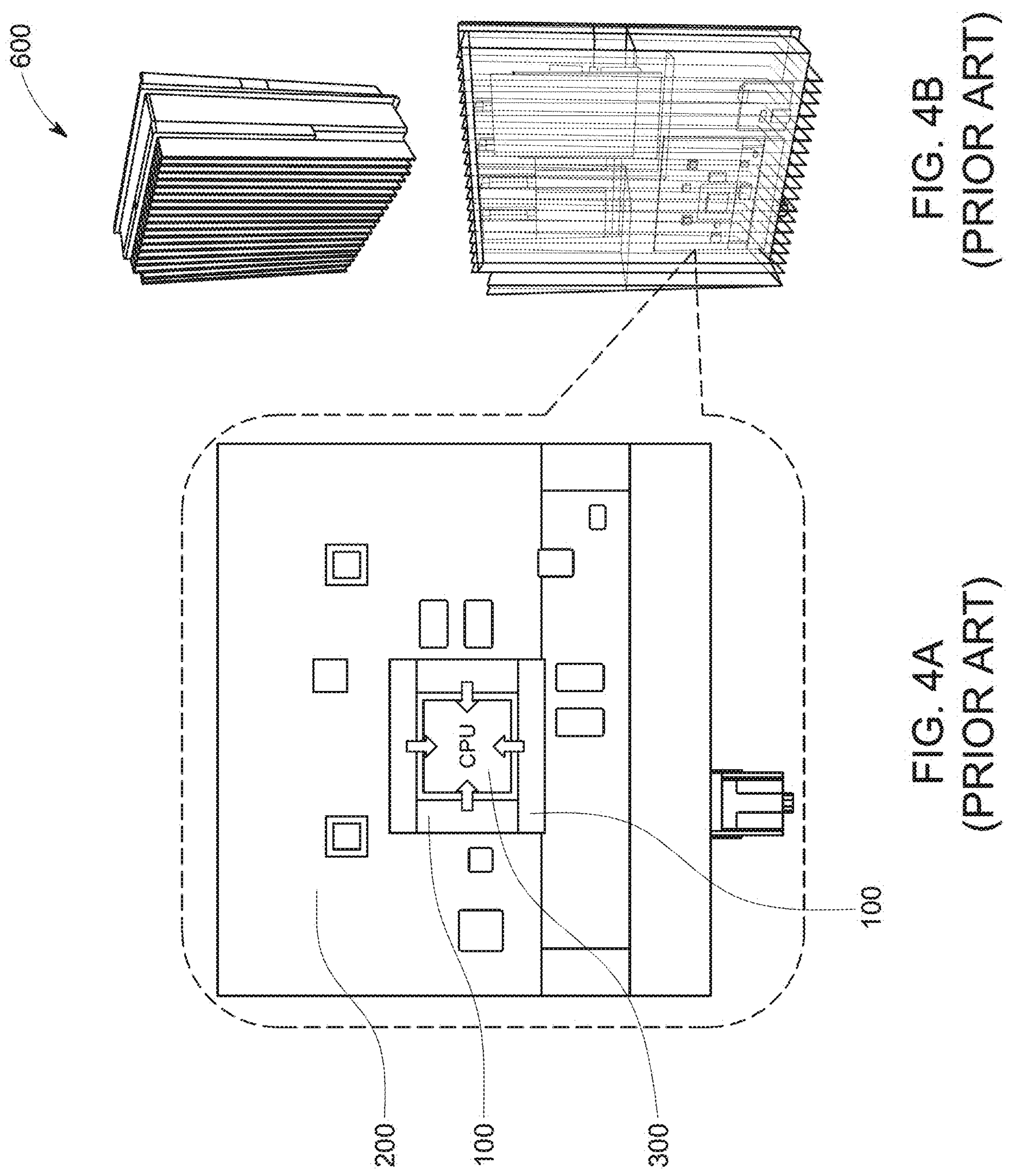
FIGS. 4A and 4B show a prior art computing system including a conventional heating mechanism.

In all cases, the same heaters (film heaters) were used. Comparing C1 and P1, when there is no need to activate the heaters, mounting the inventive module on top of the CPU did not affect its thermal performance. That is, C1 resulted in the CPU temperature of 89.9° C. and P1 resulted in the CPU temperature of 90.1° C., the difference being only 0.2° C. Between the two different configurations of the conventional heating mechanism, i.e., C2 according to the configuration shown in FIG. 3A and C3 according to the configuration shown in FIG. 3B, less power was consumed for C3, i.e., 108 W for C2 and 100 W for C3. However, compared to C3, much less power was consumed for P2, i.e., 48 W. That is, 52 W more power was consumed by C3 than P2.

According to the thermal simulation results discussed above, the inventive heating module including the heat spreader 800 is more energy efficient than the conventional heating mechanism. That is, less power is consumed by the inventive heating module. At the same time, the inventive heating module does not affect the layout of the motherboard or PCB 200 by employing the heat spreader 800. Therefore, the inventive heating module has advantages over the conventional heating mechanism used for a computing system.

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A computing system comprising:

a system chassis configured to perform as a heatsink;

a printed circuit board (PCB) enclosed within the system chassis;

a central processing unit (CPU) mounted on the PCB within the system chassis;

a film heater enclosed within the system chassis, the film heater being configured to generate heat for maintaining the CPU within an operable temperature range;

a heat spreader mounted between the CPU and the film heater, the heat spreader being configured to conduct the heat from the film heater to the CPU; and a thermal pad mounted on the area of the heat spreader such that the thermal pad is surrounded by the film heater;

wherein the film heater is mounted on peripheral areas or near four side edges of the heat spreader; and wherein the film heater surrounds an area of the heat spreader having a shape of a rectangle.

2. The computing system of claim 1, further comprising a thermal pad mounted in direct contact between the heat spreader and the system chassis.

3. The computing system of claim 1, wherein an area of the heat spreader is greater than an area of the CPU.

4. The computing system of claim 1, wherein:

a length of the heat spreader is about 50 millimeters (mm)-about 100 mm;

a width of the heat spreader is about 50 mm-about 100 mm; and the heat spreader has a shape of a rectangle.

5. The computing system of claim 1, wherein the thermal pad is configured to conduct the heat from the heat spreader to the system chassis.

6. The computing system of claim 1, wherein a thickness of the thermal pad is greater than a thickness of the film heater.

7. The computing system of claim 1, wherein an area of the thermal pad is substantially same as an area of the CPU.

8. The computing system of claim 1, wherein the thermal pad does not contact the CPU directly.

9. The computing system of claim 1, wherein the film heater does not contact the system chassis, the CPU, and the PCB directly.

10. The computing system of claim 9, wherein a space is formed between the heat spreader and the PCB such that a PCB layout is not affected by the film heater.

11. The computing system of claim 1, wherein the heat spreader is made of aluminum or copper.

12. The computing system of claim 1, wherein the operable temperature range is above 0° C. prior to booting up of the computing system, even when an environmental temperature is below 0° C., or when the environmental temperature is −10° C., −20° C., −30° C., or −40° C.

13. The computing system of claim 1, wherein a thickness of the film heater is in a range of about 0.15 mm-about 0.3 mm, and a thickness of the heat spreader is in a range of about 0.6 mm to about 2.0 mm.

14. The computing system of claim 1, wherein a thermal grease is used as an interface between the heat spreader and the CPU.

15. A heating module configured to heat a central processing unit (CPU), the heating module comprising:

a film heater configured to generate heat;

a heat spreader made of aluminum or copper, the heat spreader being configured to conduct the heat from the film heater to the CPU; and a thermal pad placed on the heat spreader, the thermal pad being surrounded by the film heater, wherein the film heater is mounted on the heat spreader, wherein the heating module is configured to be mounted on the CPU, wherein an area of the heat spreader is greater than an area of the CPU, and wherein a thermal grease is applied between the heat spreader and the CPU.

16. The heating module of claim 15, wherein:

a thickness of the thermal pad is greater than a thickness of the film heater;

the area of the heat spreader is greater than an area of the thermal pad or the area of the thermal pad is substantially same as the area of the CPU; and the thermal pad does not contact the CPU directly.

17. A computing system comprising:

a system chassis configured to perform as a heatsink;

a printed circuit board (PCB) enclosed within the system chassis;

a central processing unit (CPU) mounted on the PCB within the system chassis;

a film heater enclosed within the system chassis, the film heater being configured to generate heat for maintaining the CPU within an operable temperature range;

a heat spreader mounted between the CPU and the film heater, the heat spreader being configured to conduct the heat from the film heater to the CPU; and a thermal pad placed on the heat spreader, the thermal pad being surrounded by the film heater.

* * * * *